United States Patent [19]

Arumugham

[11] 4,125,863
[45] Nov. 14, 1978

[54] AFC WAVESHAPING CIRCUIT

[75] Inventor: Rangaswamy Arumugham, Batavia, N.Y.

[73] Assignee: GTE Sylvania Incorporated, Stamford, Conn.

[21] Appl. No.: 832,005

[22] Filed: Sep. 9, 1977

[51] Int. Cl.² .......................... H04N 5/50; H04B 1/16
[52] U.S. Cl. .................................. 358/195; 325/422; 325/459; 334/16
[58] Field of Search ................ 358/195; 325/418–420, 325/422, 423, 459, 464, 465; 334/15, 16; 331/177 V

[56] References Cited

U.S. PATENT DOCUMENTS 4,005,256  1/1977  Arumugham .......................... 358/195

*Primary Examiner*—John C. Martin
*Attorney, Agent, or Firm*—John A. Odozynski

[57] ABSTRACT

Automatic frequency control (AFC) circuitry compensating for the nonlinear tuning voltage sensitivity characteristics of voltage-controlled tuners is shown. The circuit uses a nonlinear device, such as a zener diode, to develop an amount of error correction voltage that increases with increasing tuning voltage. In addition, through the use of a VHF Bandswitch voltage, the circuit controls an impedance in a network that combines the tuning voltage with the voltage developed by the AFC system in response to tuning errors. As a result, a greater amount of AFC error correction voltage is developed on Low Band VHF channels than on High Band channels. In this manner, substantially constant AFC pull-in range is maintained both within and among High and Low Band VHF and UHF channels.

15 Claims, 3 Drawing Figures

AFC WAVESHAPING CIRCUIT

BACKGROUND OF THE INVENTION

Conventional automatic frequency control (AFC) systems in television receivers detect errors in the converted video carrier frequency, nominally 45.75 MHz. and develop an error correction voltage having a magnitude and polarity capable of correcting these errors. Correction is accomplished by applying the error correction voltage to a voltage-dependent reactance, for example, a varactor diode, in the tuner's local oscillator circuit. In tuners wherein the local oscillator's nominal operating frequency is controlled by a tuning voltage, the AFC error correction voltage can be combined in an appropriate manner with the tuning voltage so as to effect the necessary correction.

However, it has been found that voltage-controlled tuners, and particularly varactor diode tuners, exhibit a nonlinear frequency-voltage characteristic or tuning sensitivity. That is, a given change in tuning voltage at one operating frequency or on one channel may result in a change in frequency that is substantially different from the change that results at another frequency or on another channel. In particular, it has been found that as the tuning voltage is increased in order to tune to higher frequencies and as the varactor capacitance approaches its minimum value, a greater change in tuning voltage is required to cause a given change in operating frequency. Furthermore, at a particular tuning voltage on Low or High Band VHF or on UHF channels, a given change in tuning voltage will cause a change in frequency that increases from Low to High Band VHF and from High Band VHF to UHF.

This phenomenon has especially disastrous effects on the operation of conventional AFC systems. Specifically, an AFC system that develops an error correction voltage providing an appropriate pull-in range on a low VHF channel, will likely manifest an excessive pull-in range on a high VHF channel. In such situations the AFC system will have a tendency to lock onto the lower adjacent channel sound carrier, normally at 47.25 MHz, or the desired channel sound carrier, normally at 41.25 MHz. Conversely, if the AFC error correction voltage is limited to provide immunity from such false locking occurrences on a high VHF channel, the AFC pull-in range on a low VHF channel is likely to be inadequate.

"AFC Circuit", U.S. Pat. No. 4,005,256, Jan. 25, 1977, by the same inventor, describes a circuit that compensates for the reduced tuning sensitivity of UHF tuners at higher operating frequencies, i.e., at higher tuning voltages. UHF tuners are especially troublesome because of the wide frequency range, 517 to 931 MHz. through which the local oscillator must be tuned. This necessitates utilizing substantially the entire range of the varactor capacitance-to-voltage characteristic, including the most nonlinear portion. The invention cited above uses a zener diode in a circuit that combines the AFC voltage with the tuning voltage. The circuit is configured so that the zener diode is nonconductive at tuning voltages below a predetermined value. As a result, a greater amount of AFC error correction voltage is developed at higher tuning voltages, thereby compensating for the reduced tuning sensitivity and providing relatively constant AFC pull-in range on UHF channels.

However, it has also been found that varactor diodes in VHF tuners exhibit reduced tuning sensitivity at higher tuning voltages. In addition to the problems caused by the nonlinear tuning voltage-capacitance relationship, VHF tuners are subject to variations in tuning sensitivity that arise between Low Band, channels 2-6, and High Band, channels 7-13, operation. Because of both the lower absolute frequency and the greater relative range of frequencies covered on Low Band, 101 to 129 MHz compared to 221 to 257 MHz on High Band, tuning sensitivity on Low Band VHF channels is substantially lower. Accordingly, with regard to VHF tuners, it is necessary to compensate the AFC error correction voltage for variations that occur both within and between the Low and High Band channels.

FIELD OF THE INVENTION

This invention relates to automatic frequency control circuitry for television receivers and more particularly to circuitry for providing relatively constant pull-in range in spite of the nonlinear tuning voltage sensitivity of voltage-controlled tuners.

OBJECTS OF THE INVENTION

It is an object of this invention to provide an AFC system exhibiting both superior pull-in range and immunity from false locking phenomena.

It is a further object of the invention to effect relatively constant pull-in range despite tuning voltage sensitivity variations within and among the various distinct bands of channels of a television receiver.

It is a further object of this invention to develop a range of AFC error correction voltage depending on the tuning voltage sensitivity of the particular channel of operation.

SUMMARY OF THE INVENTION

In one aspect of this invention the above and further objects and advantages are achieved in a television receiver including voltage-controlled UHF and VHF tuners, a source of tuning voltage for those tuners, and an automatic frequency control system for developing an error correction voltage in order to compensate for errors in the frequency of operation.

The tuning voltage is coupled to the UHF tuner through a first resistor and to the VHF tuner through a second resistor, which resistor is also coupled to a voltage-dependent impedance for developing a range of AFC error correction voltage that is a function of the tuning voltage. A variable impedance element is connected between the voltage-dependent impedance and an output of an AFC amplifier in order to vary the range of AFC error correction voltage between at least two of the bands of channels of the television receiver.

DETAILED DESCRIPTION OF THE PREFERRED EMBODIMENT

For a better understanding of the present invention, together with other and further objects, advantages, and capabilities thereof, reference is made to the following disclosure in conjunction with the accompanying drawings.

Figure 1:
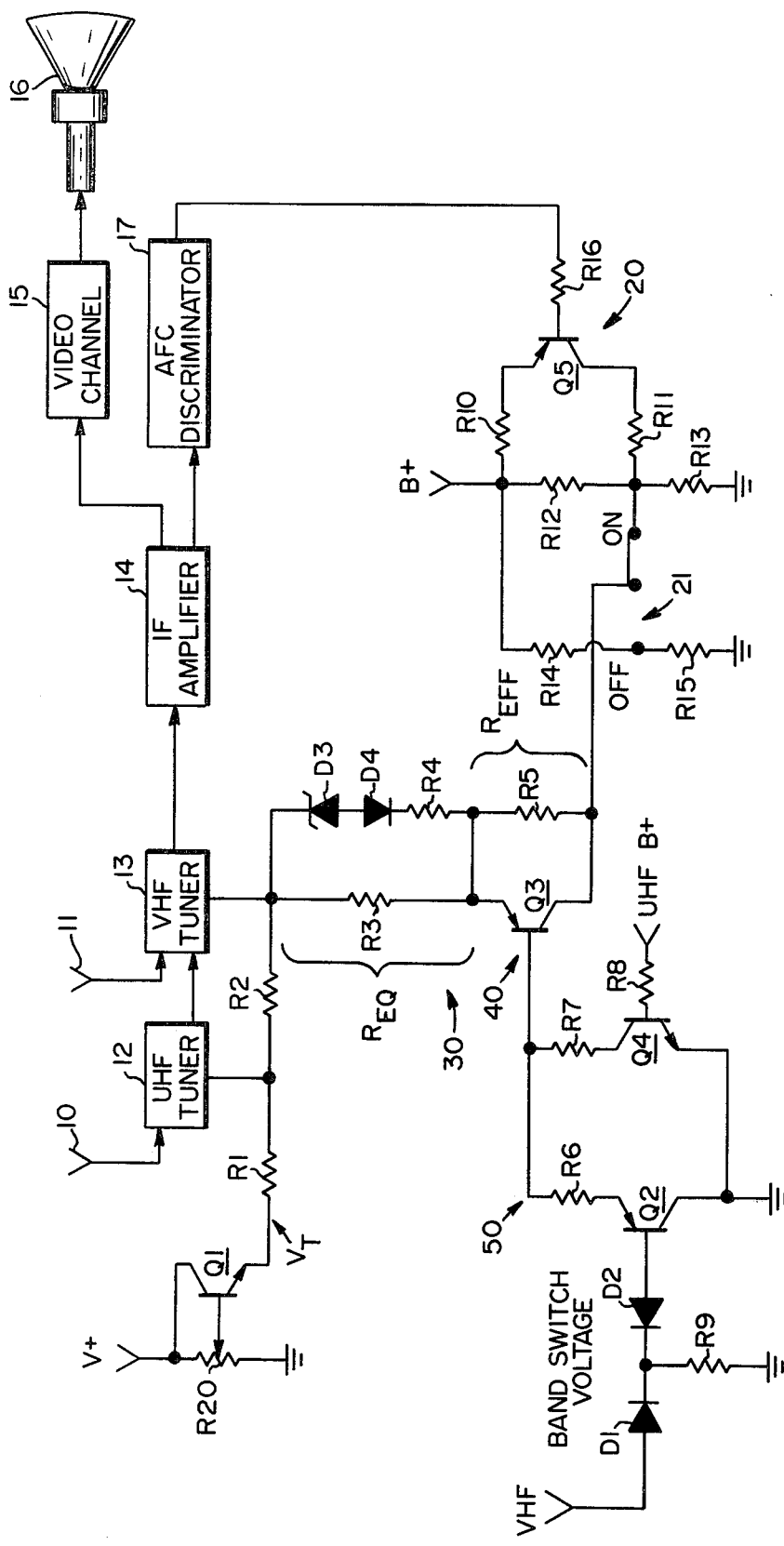
FIG. 1 is a circuit diagram of the subject invention, including block-diagram representation of conventional cooperating circuitry.

As illustrated in FIG. 1, an antenna 10 couples a modulated radio frequency (RF) carrier signal in the ultra-high frequency (UHF) range to a UHF tuner 12. Similarly, an antenna 11 couples an RF carrier signal in the very-high frequency (VHF) range to a VHF tuner 13. The respective tuners convert RF video carrier signals to an intermediate frequency (IF) of typically 45.75 Megahertz (MHz). Frequency conversion is conventionally accomplished by heterodyning the received RF carrier signal with a local oscillator signal having a frequency 45.75 MHz above the nominal RF carrier signal frequency. Although it is conventional for the VHF tuner to be disabled during operation on a UHF channel, in many television receivers the VHF mixer is enabled in order to enhance the sensitivity of the receiver in the UHF mode. The 45.75 MHz output of the UHF tuner can then be coupled to and amplifier by the VHF mixer. The mixer output is coupled to the input of an IF amplifier 14 where it undergoes further amplification and filtering. The output of the IF amplifier is demodulated and processed in a video channel 15 and coupled to a cathode ray tube 16. At least a portion of the output of the IF amplifer is coupled to an AFC system including an AFC discriminator 17 and an AFC amplifier 20. The discriminator can be one of many known types and provides an output signal indicative of the discrepancy between the actual frequency of the converted IF video carrier and the nominal frequency, 45.75 MHz. In the particular embodiment presently being described, the discriminator provides an output signal of negative polarity in response to input signals at a frequency below 45.75 MHz and an output signal of positive polarity in response to input signals at a frequency above 45.75 MHz. The discriminator output is coupled to an AFC amplifier 20 comprising resistors R10, R11, R12, and R13 and a transistor Q5. R12 and R13 are series connected between a source of potential, B+, which may be 24 volts, and circuit ground. Q5 has a base connected through R16 to the output of the AFC discriminator, an emitter connected through R10 to B+, and a collector connected through R11 to the junction R12 and R13 and to the terminal of an AFC switch 21 corresponding to the ON position. The terminal corresponding to the OFF position is connected by a resistor R14 to B+ and by a resistor R15 to circuit ground. In a manner to be more precisely described below, an AFC voltage present on the common terminal to the AFC switch is combined with the nominal tuning voltage and applied to the respective tuning control terminals of the UHF and VHF tuners in order to establish the frequency of operation. With the AFC switch in the OFF position, this voltage is determined by the division across R14 and R15 and is approximately equal to 5 volts. With the AFC switch in the ON position, the AFC voltage is determined by the operation of the AFC amplifier. When the tuners are correctly tuned and the IF video carrier is at 45.75 MHz, Q5 will be rendered slightly conductive by virtue of a small bias potential, approximately 0.5 volts, developed by the AFC discriminator. The voltage at junction of R12 and R13 will be approximately 5 volts. When the video carrier is below 45.75 MHz, Q5 will be driven toward saturation and the AFC voltage will be approximately 8 volts. When the video carrier is above 45.75 MHz, Q5 will be cut off and the AFC voltage will be approximately 3 volts.

A normal set-up procedure for a given channel is to place the AFC switch in the OFF position, thereby establishing the nominal 5 volts at the common terminal of the AFC switch. The wiper of variable resistor R20 is adjusted to provide a tuning voltage at the emitter of transistor Q1 necessary to convert the desired channel video carrier to 45.75 MHz. As shown, R20 is connected between a voltage source V+, adequate to turn the entire range of operating frequencies, and circuit ground. The tuning voltage, $V_T$, at the emitter of Q1 is coupled through a first resistor R1 to the UHF tuning control terminal and through a series-connected second resistor R2 to the VHF tuning control terminal. The voltages at the respective tuning control terminals determine the capacitance a voltage controlled, i.e., varactor, diode and thereby establish the frequency of operation of the UHF and VHF local oscillators. With variable resistor R20 properly adjusted an AFC set-up coil in the discriminator is adjusted until the voltage at the junction of R12 and R13 is 5 volts. The AFC switch is placed on the ON position and the AFC system will operate to correct any subsequent deviation in the converted video carrier frequency.

Conventional AFC systems operate to develop an error correction voltage that is added to the nominal tuning voltage so as to maintain the IF video carrier frequency at or near 45.75 MHz. One measure of the performance of an AFC system is its pull-in range. Pull-in range may be defined as the magnitude of the range of frequency error with the AFC system is capable of correcting to within ± 100 Kilohertz (KHz). For example, if tuning errors resulting in an IF video carrier in the range of 47.25 MHz to 44.25 MHz (45.75 ± 1.5 MHz) can be reduced to a range of 45.85 MHz to 45.65 MHz (45.75 MHz ± 100 KHz), the AFC system is said to have a pull-in range of ± 1.5 MHz.

Although it is desirable to provide as great an amount of correction as possible, an excessive pull-in range may result in the AFC system locking onto the lower adjacent sound carrier, nominally at a frequency of 47.25 MHz, or the desired channel sound carrier, nominally at 41.25 MHz. Because pull-in range is related to the amount of error correction voltage developed by the AFC system, care must be taken to assure that the range or error correction voltage is adequate to provide the necessary error correction but not so excessive as to give rise to false locking phenomena.

However, because of the wide range of operating frequencies that must be covered by the varactor diodes and because of nonlinearities of the varactor capacitance-to-voltage characteristic, it has been found that the tuning voltage sensitivity of varactor controlled receivers varies from channel to channel. That is, a given increment in either the tuning voltage or the error correction voltage will cause a greater frequency deviation on one channel than on another. In general, it has been found that the tuning sensitivity tends to decrease on both UHF and VHF bands as the tuning voltage increases. In addition, tuning voltage sensitivity is greater on High Band VHF, channels 7-13, than on Low Band VHF, channels 2-6.

With regard to operation on UHF channels, U.S. Pat. No. 4,005,256 by the same inventor discloses a circuit for compensating for decreased UHF tuning voltage sensitivity at tuning voltages above, for example, 9 volts. In an analogous fashion this invention incorporates a voltage-dependent resistance means 30, designated as $R_{EQ}$ in FIG. 1 herein, comprising a fixed resistor R3 in parallel with a nonlinear conduction device in the form of the series combination of a zener diode 3, a diode D4, and a resistor R4. In a manner that will become apparent, $R_{EQ}$ operates to effect an increased range of error correction voltage at higher tuning voltages, thereby compensating for the reduced tuning sensitivity and maintaining a relatively constant AFC pull-in range. It should be noted, however, that the invention referred to above provided compensation only on UHF channels; the instant invention provides compensation on both UHF and VHF channels.

In addition to the reduced tuning sensitivity at higher tuning voltages, conventional voltage-controlled tuners exhibit less tuning sensitivity on Low Band VHF channels than on High Band VHF channels. A variable resistance means 40, connected between $R_{EQ}$ and the common terminal of the AFC switch compensates for this effect. Resistance means 40 comprises a transistor Q3 in parallel with a resistor R5. The total effective resistance, $R_{EFF}$, is the value of the parallel combination of R5 and the output resistance of Q3.

The value of $R_{EFF}$ is controlled by an impedance control means 50 comprising a first transistor Q2 and second transistor Q4, diodes D1 and D2, and resistors R6, R7, R8 and R9. During operation on a High Band VHF channel, the VHF Bandswitch Voltage will be approximately 24 volts; diode D1 will be conductive and diode D2 will be back-biased. Transistor Q2 will be cut off and there will be no source of base current for Q3. Q3 will have a very high output resistance and $R_{EFF}$ will be approximately equal to R5. During operation on a Low Band channel, the VHF Bandswitch voltage will be open-circuited. Base current for Q2 will be provided through D2 and a resistor R9 to circuit ground. As a result Q2 will provide base current for Q3 through a resistor R6 connected between the emitter of Q2 and the base of Q3. Q3 will be saturated and $R_{EFF}$ will be approximately zero.

Similarly, a source of voltage, UHF B+, is connected through a resistor R8 to the base of a transistor Q4. Q4 has a collector connected through a resistor R7 to the base of Q3 and an emitter connected to circuit ground. UHF B+ is 24 volts during operation on a UHF channel and otherwise open circuited. As a result, Q4 will be conductive, Q3 will be saturated, and $R_{EFF}$ will be approximately zero during operation on a UHF channel.

The effect of the above described circuitry is to provide a range of AFC error correction voltage that varies in a fashion so as to compensate for variations in tuning voltage sensitivity.

In the UHF mode the total range of AFC error correction voltage, $V_{EC}$, is given by:

$$V_{EC} = V_{AFC} \times \left( \frac{R1}{R1 + R2 + R_{EQ} + R_{EFF}} \right).$$

where $V_{AFC}$ is the total range of AFC voltage, in this embodiment 3 to 8 volts. Because $R_{EFF}$ is approximately zero in the UHF mode, the range of error correction voltage will be developed as described in U.S. Pat. No. 4,005,256, cited above.

In the VHF mode:

$$V_{EC} = V_{AFC} \times \left( \frac{R1 + R2}{R1 + R2 + R_{EQ} + R_{EFF}} \right).$$

Figure 2:
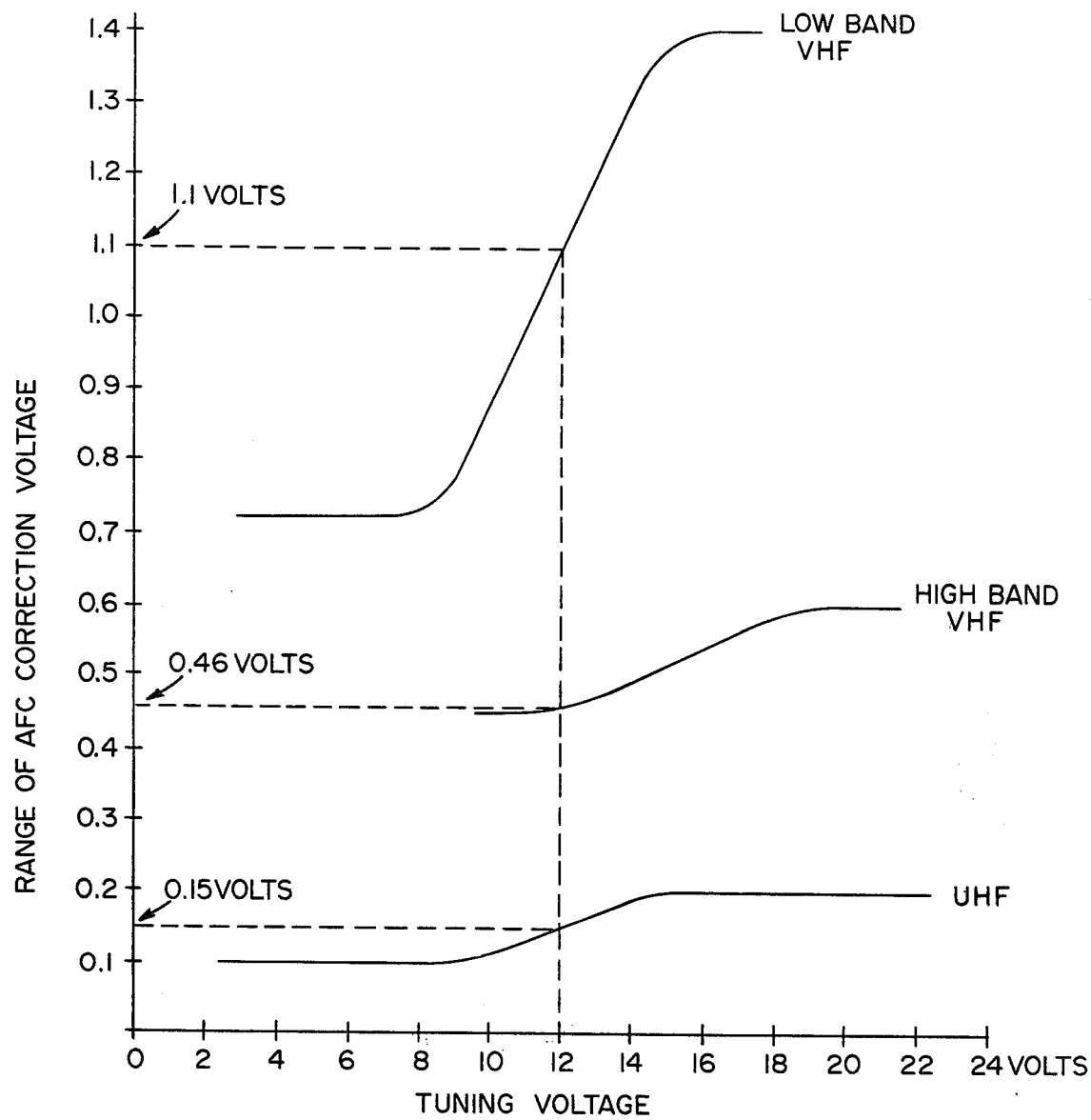
FIG. 2 is a graphical representation of the manner in which the subject invention operates to develop a range of AFC error correction voltage that varies both within and among the distinct bands of channels covered by a television receiver.

For a low Band VHF channel, $R_{EFF}$ will be zero and the error correction voltage will vary as shown in FIG. 2. For tuning voltages below the value required to cause D3 to conduct, $R_{EQ}$ will be approximately equal to R3. D3 is chosen to conduct at tuning voltages above 9 volts. At tuning voltages slightly above 9 volts, D3 will begin to conduct and will exhibit a dynamic impedance, $R_D$, that decreases with increasing tuning voltage. $R_{EQ}$ will be equal to the parallel combination of R3 and ($R_D$ + R4) and will have a value equal to $$\frac{R3 (R_D + R4)}{R3 + R_D + R_4}.$$

This gives rise to the linearly sloping portion of the Low Band VHF curve in FIG. 2. For sufficiently high voltages, the value of $R_D$ becomes insignificant and $$R_{EQ} = \frac{(R3)(R4)}{(R3 + R4)}.$$

In summary, on a Low Band VHF channel for which the tuning voltage is less than 9 volts, the range of AFC error correction voltage has a substantially constant value equal to approximately 0.70 volts, as shown in FIG. 2. Consequently, as the AFC voltage varies from its nominal value of 5 volts within the range of 3 to 8 volts, the voltage at the tuning control terminal of the VHF tuner will vary from its nominal value, as established by $V_T$, within a range of 0.70 volts. For example, if the nominal tuning voltage for a given Low Band VHF channel is 6.0 volts, the AFC error correction voltage could be within the range of 5.72 to 6.42 volts. As the tuning voltage increases beyond 9.0 volts, the range of error correction voltage also increases, until it reaches a maximum value of approximately 1.4 volts at tuning voltages above approximately 15 volts. Therefore, on a Low Band VHF channel with a nominal tuning voltage of 16.0 volts, the range of AFC error correction voltage could be from 15.44 to 16.84 volts.

A similar relationship between the range of AFC error correction voltage and tuning voltage exists on High Band VHF channels. However, because the value of $R_{EFF}$ is equal to R5, the error correction voltage will be a smaller proportion of the tuning voltage. As shown in FIG. 2, for values of tuning voltage below approximately 10 volts, the range of AFC error correction voltage is approximately 0.45 volts; at values above 20 volts the range is approximately 0.60 volts.

Figure 3:
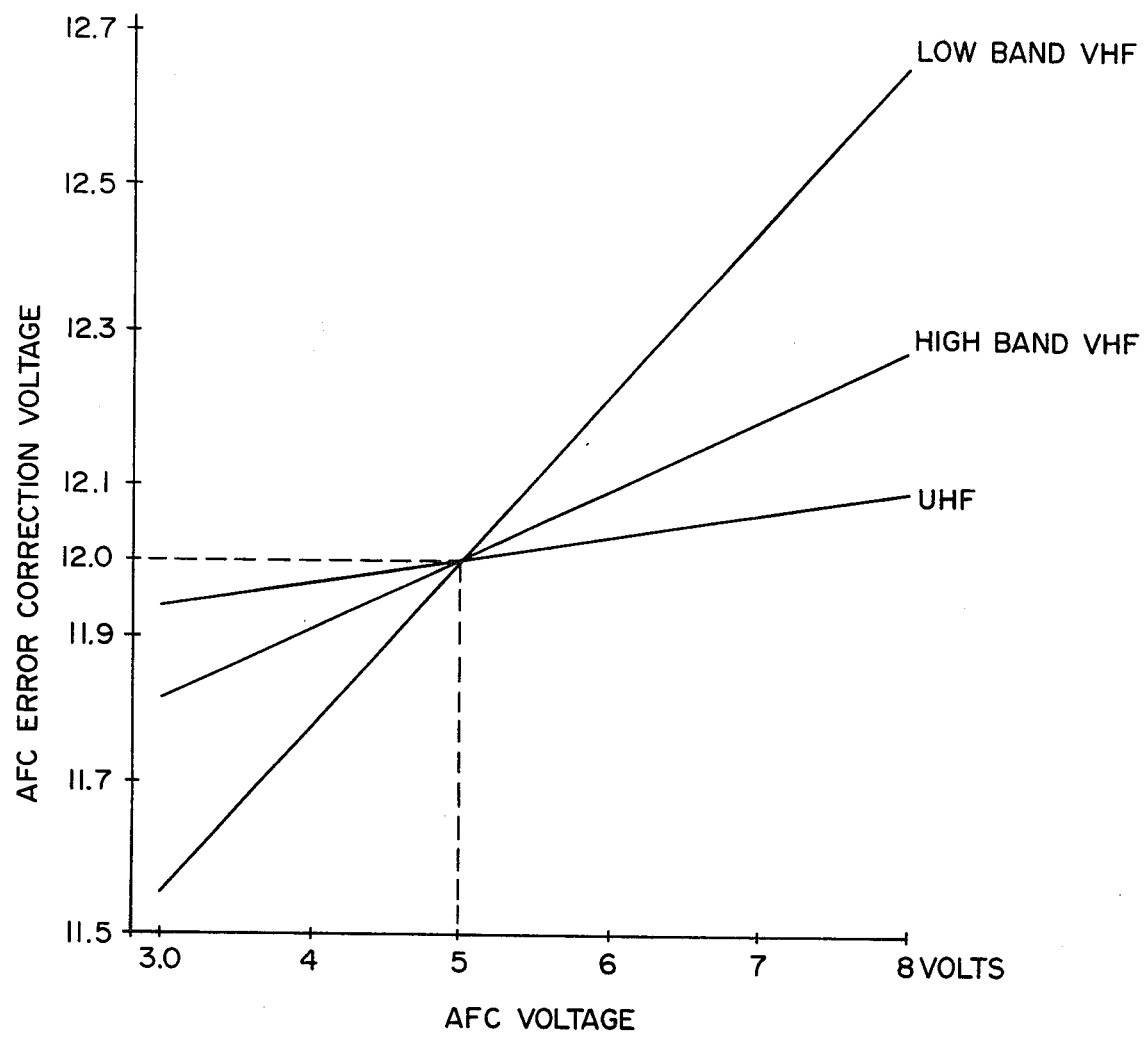
FIG. 3 illustrates the manner in which, for a given tuning voltage, the subject invention develops a range of AFC error correction voltage that depends on the band of channels within which the receiver is operating.

FIG. 3 illustrates the relative ranges of error correction voltage on a Low Band VHF, a High Band VHF, and a UHF channel, all assumed to have been tuned with nominal tuning voltage of 12.0 volts. The respective ranges of AFC error correction voltage are, as shown in FIG. 2, approximately 1.1, 0.46, and 0.15 volts. Consequently, as shown in FIG. 3, as the AFC voltage varies from 3 to 8 volts, the AFC error correction voltage can vary from 11.56 to 12.66 volts on a Low Band VHF channel, from 11.82 to 12.28 volts on a High Band VHF channel, and from 11.94 to 12.09 volts on a UHF channel.

While there has been shown and described what at present is considered to be the preferred embodiment of the invention, it will be obvious to those skilled in the art that various changes and modifications may be made therein without departing from the invention as defined by the appended claims. In particular although the variable impedance control is shown to have two distinct magnitudes, viz., zero during operation in low VHF channels and R5 during operation in high VHF and UHF channels, it is possible, with minor modification of the circuit, for it to have three distinct values in each of the three bands of channels.

What is claimed is:

1. In a television receiver including a radio frequency tuner comprising a UHF tuner and a VHF tuner with respective UHF and VHF tuning control terminals for the application of respective control voltages for establishing the frequency of operation of said tuners, said receiver further including an automatic frequency control system having an AFC amplifier for developing an AFC voltage for effecting an AFC error correction voltage at said tuning control terminals in order to compensate for errors in the frequency of operation of said tuners, a source of tuning voltage coupled to said UHF tuning control terminal through a series-connected first resistance and to said VHF tuning control terminal through a series-connected second resistance, and a voltage-dependent impedance connected to said second resistance, said impedance comprising the parallel combination of a resistor and a nonlinear conduction device for developing a range of AFC error correction voltage which is a function of said tuning voltage, an improved AFC waveshaping circuit wherein the improvement comprises a variable impedance element connected between said voltage-dependent impedance and an output of said AFC amplifier, said element for varying the range of AFC error correction voltage between at least two distinct bands of channels in response to a signal indicative of operation on a channel within at least one of said bands.

2. An improved AFC waveshaping circuit as defined in claim 1 wherein said variable impedance element comprises the parallel combination of a transistor and a resistor, said transistor being non-conductive during operation on a channel within a predetermined band of channels and conductive during operation on channels within at least one other distinct band of channels.

3. An improved AFC waveshaping circuit as defined in claim 1 above wherein said variable impedance element comprises an electrode connected to an impedance control means so that said range is a first predetermined function of the AFC voltage during operation on a channel within a first distinct band of channels and a second predetermined function of the AFC voltage during operation on a channel within a second distinct band of channels.

4. An improved AFC waveshaping circuit as defined in claim 3 above wherein said range is a third predetermined function of the AFC voltage during operation on a channel within a third distinct band of channels.

5. An improved AFC waveshaping circuit as defined in claim 3 above wherein said impedance control means comprises first and second transistors coupled to said electrode of said variable impedance element.

6. An improved AFC waveshaping circuit as defined in claim 5 above wherein said first transistor has a base coupled to a source of VHF Bandswitch voltage and said second transistor has a base coupled to a source of UHF tuner energizing voltage.

7. An improved AFC waveshaping circuit as defined in claim 6 above wherein said base of said first transistor is also coupled to circuit ground so that said transistor of said variable impedance element is rendered conductive during operation on a Low Band VHF channel and substantially nonconductive during operation on a High Band VHF channel.

8. An improved AFC waveshaping circuit as defined in claim 7 above wherein said second transistor is coupled to said source of UHF tuner energizing voltage so that said transistor of said variable impedance element is rendered substantially conductive during operation on a UHF channel.

9. An improved AFC waveshaping circuit as defined in claim 8 wherein with each of said Low Band VHF, High Band VHF, and UHF bands said range of AFC error correction voltage increases as said tuning voltage increases beyond a predetermined value and wherein among said bands for a given tuning voltage said range is of a first lowest value during operation on a UHF channel, a second intermediate value during operation on a High Band VHF channel, and a third greatest value during operation on a Low Band VHF channel.

10. In a television receiver comprising a UHF tuner and a VHF tuner with respective UHF and VHF tuning control terminals for the application of respective control voltages for establishing the frequency of operation of said tuners, an automatic frequency control system for developing an AFC voltage in response to errors in the frequency of operation of said tuners, and a source of tuning voltage coupled to said UHF tuning control terminal through a series-connected first resistance and to said VHF tuning control terminal through a series-connected second resistance, an AFC waveshaping circuit for effecting an AFC error correction voltage at said tuning control terminals comprising:

a voltage-dependent impedance connected to said second resistance, said impedance comprising the parallel combination of a resistor and a nonlinear conduction device for developing a range of AFC error correction voltage which increases with increasing tuning voltage;

a variable impedance element connected to said voltage-dependent impedance and to an output of an AFC amplifier; and an impedance control means connected to said element and coupled to a signal indicative of operation on a channel within one of at least two distinct bands of channels for varying said range of AFC error correction voltage between said distinct bands in response to said signal.

11. An AFC waveshaping circuit as defined in claim 10 wherein said variable impedance element comprises a parallel-connected transistor and resistor, said transistor rendered conductive during operation on channels within at least one of said distinct bands and nonconductive during operation on channels within at least one other of said distinct bands.

12. An AFC waveshaping circuit as defined in claim 10 wherein said distinct bands consist of Low Band VHF, High Band VHF, and UHF Bands and wherein said transistor is rendered conductive during operation on channels within the UHF and Low Band VHF bands and nonconductive during operation on channels within the High Band VHF channels.

13. An AFC waveshaping circuit as defined in claim 10 wherein said impedance control means comprises first and second transistors coupled to the base of said transistor comprised by said variable impedance element.

14. An AFC waveshaping circuit as defined in claim 13 wherein said first transistor is coupled to and rendered conductive by a source of UHF energizing voltage.

15. An AFC waveshaping circuit as defined in claim 14 wherein said second transistor is coupled through a first and a second diode to a source of VHF Bandswitch voltage and coupled through a resistor and said second diode to circuit ground so as to render said second transistor conductive during operation on channels within the Low Band VHF band.

* * * * *